US010820410B2

(12) United States Patent
Lee

(10) Patent No.: US 10,820,410 B2
(45) Date of Patent: Oct. 27, 2020

(54) LOOP SHAPED RADIATION REDUCTION FILTER FOR HIGH SPEED DIFFERENTIAL SIGNAL TRACE

(71) Applicant: QUANTA COMPUTER INC., Taoyuan (TW)

(72) Inventor: Cheng-Hsien Lee, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 0 days.

(21) Appl. No.: 16/291,941

(22) Filed: Mar. 4, 2019

(65) Prior Publication Data
US 2020/0288566 A1 Sep. 10, 2020

(51) Int. Cl.
H05K 1/02 (2006.01)

(52) U.S. Cl.
CPC ......... H05K 1/0233 (2013.01); H05K 1/0298 (2013.01)

(58) Field of Classification Search
CPC ........ H01P 1/203; H01P 1/2039; H01P 3/026; H05K 1/0233; H05K 1/0298
USPC .......................................................... 333/12
See application file for complete search history.

(56) References Cited

U.S. PATENT DOCUMENTS

| 2014/0062611 A1 | 3/2014 | Wu et al. |
| 2016/0087323 A1 | 3/2016 | Wu et al. |

FOREIGN PATENT DOCUMENTS

| CN | 105811057 A | 7/2016 |
| CN | 104205160 B | 7/2017 |
| JP | 3513333 B2 | 3/2004 |
| JP | 2014160690 A | 9/2014 |
| KR | 101466774 B1 | 11/2014 |
| TW | 201004037 A | 1/2010 |
| TW | I478636 B | 3/2015 |
| WO | 2011004453 A1 | 1/2011 |

OTHER PUBLICATIONS

Extended European Search Report for EP Application No. 19176987.6, dated Nov. 25, 2019.
Wei Zhuang, et al., Common-Mode Suppression Design for Gigahertz Differential Signals Based on C-Slotline; Progress in Electromagnetics Research C, vol. 61, 2016, pp. 17-26.
TW Office Action for Application No. 108114902, dated Feb. 13, 2020, w/ First Office Action Summary.

(Continued)

*Primary Examiner* — Robert J Pascal
*Assistant Examiner* — Kimberly E Glenn
(74) *Attorney, Agent, or Firm* — Nixon Peabody LLP

(57) ABSTRACT

A high speed circuit and a method for fabricating the same is disclosed. The high speed circuit has a printed circuit board. A pair of first and second differential traces are formed on a first surface of the printed circuit board. The differential traces carry an electrical signal. A partial loop extends through the printed circuit board. The partial loop includes first and second end slots under the first and second differential traces. The partial loop includes a pair of side slots substantially parallel to the differential traces. An anchor member connects the printed circuit board to an island formed by the first and second end slots and side slots. The anchor member forms a gap in one of the end slots or side slots. The length of the side slots and the length of the gap is selected to reduce a target common mode frequency from the electrical signal.

18 Claims, 6 Drawing Sheets

(56) References Cited

OTHER PUBLICATIONS

TW Search Report for Application No. 108114902, dated Feb. 13, 2020, w/ First Office Action.
JP Office Action for Application No. 2019-127146, dated Aug. 4, 2020, w/ First Office Action Summary.

| Lpath | Lgap | Expected Reduction Frequency | Actual Reduction Frequency |
|---|---|---|---|
| 348mil | 4mil | 7.92 | 7.79 |
| 348mil | 20mil | 8.52 | 8.55 |
| 348mil | 40mil | 9.41 | 9.54 |
| 348mil | 60mil | 10.5 | 10.53 |
| 348mil | 80mil | 11.88 | 11.9 |
| 348mil | 100mil | 13.68 | 13.04 |
| 428mil | 80mil | 8.80 | 8.91 |

FIG. 5

LOOP SHAPED RADIATION REDUCTION FILTER FOR HIGH SPEED DIFFERENTIAL SIGNAL TRACE

TECHNICAL FIELD

The present disclosure relates generally to high speed traces, and more specifically, to a partial loop structure on a circuit board to reduce radiation for a high speed differential signal trace.

BACKGROUND

High speed differential signal traces are widely used in server/storage product designs. Many server/storage products include a chassis that mounts different printed circuit boards for electronic components. The printed circuit boards include various signal traces to provide signals to the components on the boards. Signal traces generally are arranged in differential trace pairs for a particular signal line. Such differential traces on a printed circuit board have different modes, including differential mode, common mode, and mode conversion between differential signals during transmission. Since more and more product applications include differential signal transition between different boards or between boards and cables, common mode energy will radiate through connectors over these transitions to holes in a chassis. Common mode energy results in a signal on both differential traces. Common mode energy can therefore generate noise that interrupts the transmission of signals over the traces and create interference problems. Thus, there will be radiation when differential signals pass through a skewed channel or a printed circuit board.

FIG. 1 is an example of a prior art return current circuit trace 10 on a printed circuit board 12. The printed circuit board 12 is attached to a ground plane layer 14. The current circuit trace 10 includes two differential traces 22 and 24 on one surface 20 of the printed circuit board 12. The ground plane layer 14 contacts the opposite surface of the printed circuit board 12. An arrow 30 shows the insertion current in the differential trace 22. An arrow 32 shows an induction current in the differential trace 24. An arrow 34 shows a return current that is generated in the ground plane layer 14 under the differential trace 22. As shown in FIG. 1, common mode energy is generated by the insertion current represented by the arrow 30 minus coupling terms.

In current circuit designs, a common mode filter is used to reduce signal radiation on differential traces. Thus common mode filter circuit components are implemented on a printed circuit board on the routing of differential traces to reduce signal radiation from the traces. The use of a common mode filter is effective, but the filter circuit requires footprint space on the printed circuit board. This creates space issues for circuit board layout in view of the need for placing as many components as possible on a printed circuit board to use all of the physical surface space.

Thus, there is a need for a common mode filter in a printed circuit board having differential traces with smaller spacing and an effective bandwidth to reduce radiation caused by common mode energy. There is a need to apply a partial loop shape on the printed circuit board to develop a common mode filter.

SUMMARY

One disclosed example is a high speed circuit. The high speed circuit has a printed circuit board having a first surface. A pair of first and second differential traces is on the first surface of the printed circuit board. The differential traces carry an electrical signal. A partial loop extends through the printed circuit board. The partial loop includes first and second end slots under the first and second differential traces. The partial loop includes a pair of side slots substantially parallel to the differential traces. An anchor member connects the printed circuit board to an island formed by the first and second end slots and side slots. The anchor member forms a gap in one of the end slots or side slots. The length of the side slots and the length of the gap are selected to reduce a target common mode frequency from the electrical signal.

Another disclosed example is a method of producing a low interference differential trace. First and second differential traces are formed on a first surface of a printed circuit board. A path length and gap length for a partial loop on the printed circuit board are selected to reduce a target common mode frequency from a signal carried by the traces. A first end slot and a second end slot are formed under the first and second differential traces. The first and second end slots are separated by the determined path length. A pair of side slots connecting the first and second end slots is formed. An anchor member is formed to create a gap in one of the end slots or one of the side slots. The length of the gap is the determined gap length.

Another disclosed example is a high speed differential trace structure including a first trace and a parallel second trace. The structure has a printed circuit board layer having a top surface and an opposite bottom surface. The first and second traces are formed on the top surface. A ground plane layer has a top layer in contact with the opposite bottom surface of the printed circuit board. A partial loop extends through the printed circuit board. The partial loop includes first and second end slots under the first and second differential traces, and a pair of side slots substantially parallel to the differential traces. An anchor member connects the printed circuit board to an island formed by the first and second end slots and side slots. The anchor member forms a gap in one of the end slots or side slots. The length of the side slots and the length of the gap are selected to reduce a target common mode frequency based on electrical signals carried through the differential traces.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims.

BRIEF DESCRIPTION OF THE DRAWINGS

The disclosure will be better understood from the following description of exemplary embodiments together with reference to the accompanying drawings, in which:

FIG. 5 is a table of predicted and measured frequency response for partial loops having different lengths and gap widths.

Figure 1:
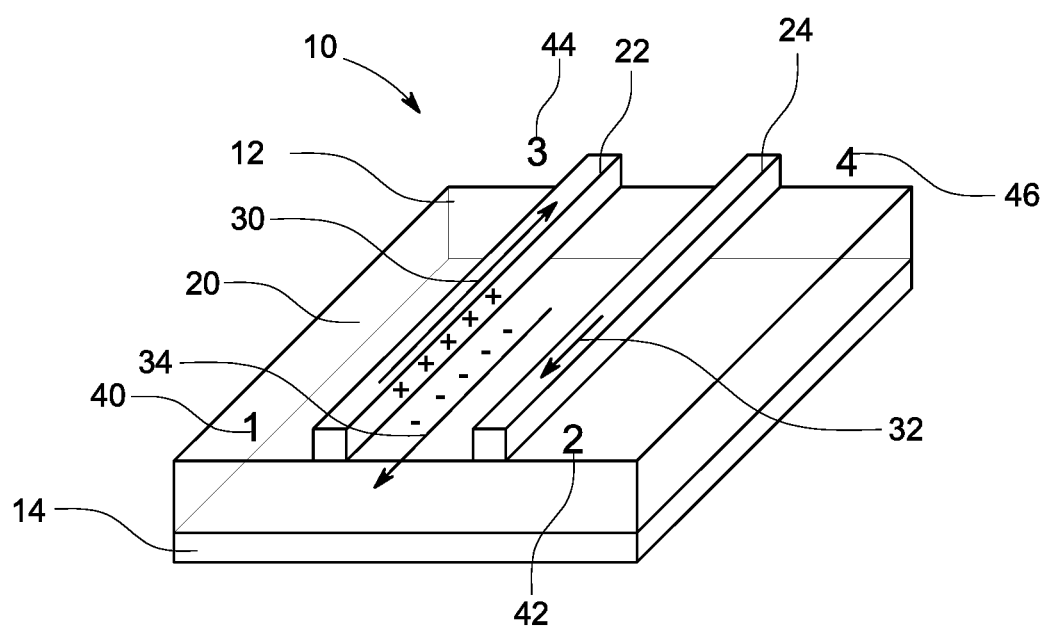
FIG. 1 is a diagram of a prior art printed circuit board with a differential trace that emits radiation from common mode operation.

The present disclosure is susceptible to various modifications and alternative forms. Some representative embodiments have been shown by way of example in the drawings and will be described in detail herein. It should be understood, however, that the invention is not intended to be limited to the particular forms disclosed. Rather, the disclosure is to cover all modifications, equivalents, and alternatives falling within the spirit and scope of the invention as defined by the appended claims.

DETAILED DESCRIPTION OF THE ILLUSTRATED EMBODIMENTS

The present inventions can be embodied in many different forms. Representative embodiments are shown in the drawings, and will herein be described in detail. The present disclosure is an example or illustration of the principles of the present disclosure, and is not intended to limit the broad aspects of the disclosure to the embodiments illustrated. To that extent, elements and limitations that are disclosed, for example, in the Abstract, Summary, and Detailed Description sections, but not explicitly set forth in the claims, should not be incorporated into the claims, singly or collectively, by implication, inference, or otherwise. For purposes of the present detailed description, unless specifically disclaimed, the singular includes the plural and vice versa; and the word "including" means "including without limitation." Moreover, words of approximation, such as "about," "almost," "substantially," "approximately," and the like, can be used herein to mean "at," "near," or "nearly at," or "within 3-5% of," or "within acceptable manufacturing tolerances," or any logical combination thereof, for example.

Figure 2A:
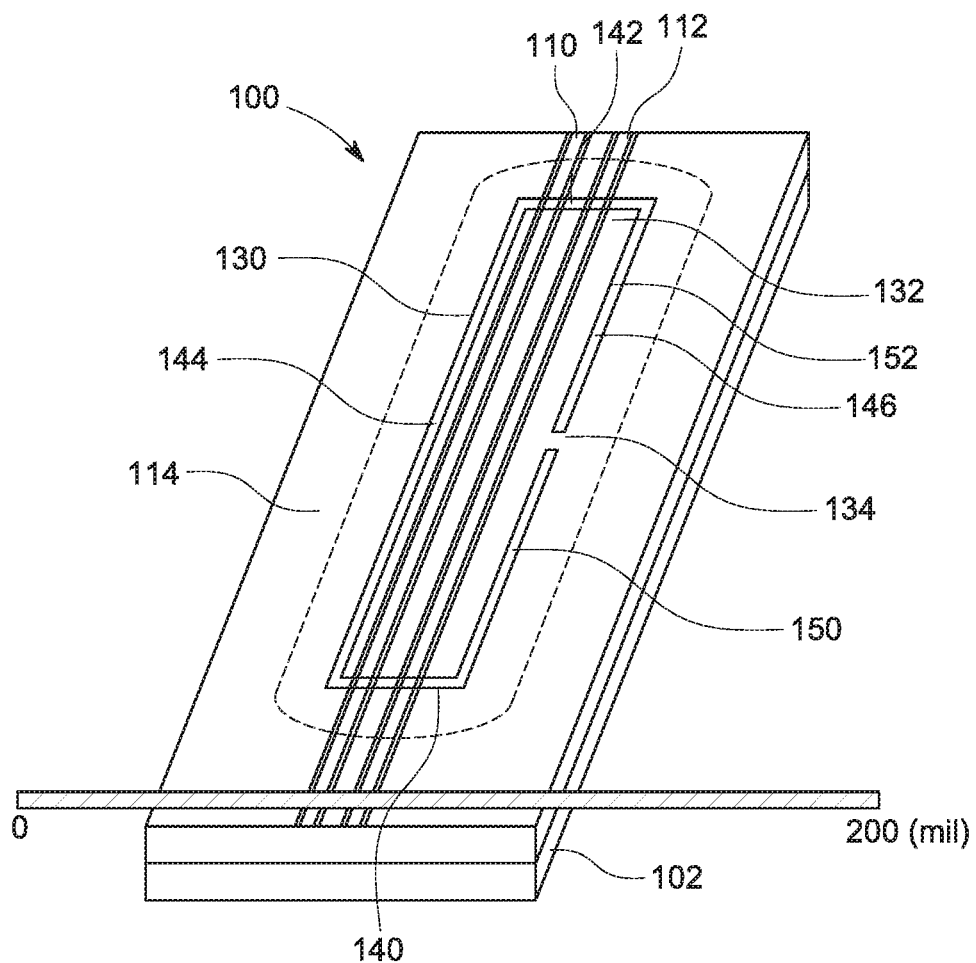
FIG. 2A is a perspective view of a printed circuit board with a differential trace and a partial loop that functions as a filter for common mode radiation.
Figure 2B:
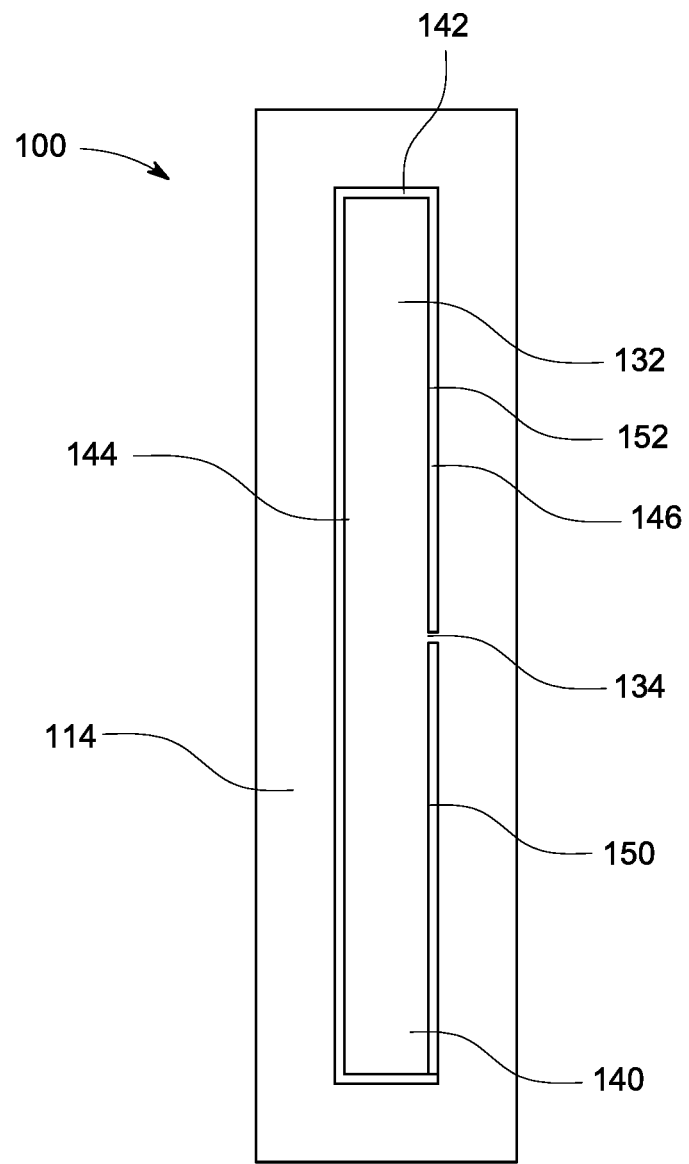
FIG. 2B is a top view of the printed circuit board in FIG. 2A.

FIG. 2A shows a perspective view of a printed circuit board 100 having a partial loop structure that functions as a common mode filter for reducing radiation in accordance with the present disclosure. FIG. 2B shows a top view of the printed circuit board 100. The printed circuit board 100 is mounted on a ground layer 102. As shown in FIG. 2A, the printed circuit board 100 includes a pair of differential signal traces 110 and 112 that are fabricated on a top surface 114 of the printed circuit board 100. The signal traces 110 and 112 form a channel that allows signals to be sent between a transmitter component and a receiver component. Although the traces 110 and 112 in this example are roughly rectangular in shape, the traces may be of any shape. Further, additional traces may be formed on the opposite side of the printed circuit board 100 from the top surface 114.

In order to decrease interference, the printed circuit board 100 includes a partial loop structure 130 that reduces common mode energy. For example, partial loop structure 130 may reduce common mode energy at an example target frequency of 8 GHz. The incorporation of such a partial loop structure 130 thereby decreases the electronic noise generated by traces on the printed circuit board 100. The target frequency depends on the trace data rate of the signals transmitted on the traces 110 and 112. The target frequency is determined by interference testing of the printed circuit board 100.

The partial loop 130 is formed by etching out part of the printed circuit board 100. Thus, an island 132 of the printed circuit board material is formed under the signal traces 110 and 112. The island 132 is attached to the rest of the printed circuit board 100 via a bridge 134. As will be explained, the area required for the partial loop 130 is less than what is currently used by filters, freeing up more surface area on the printed circuit board 100. The partial loop 130 includes a pair of end slots 140 and 142 etched through the printed circuit board 100. One end of each of the end slots 140 and 142 is joined by a pair of side slots 144 and 146. The side slots 144 and 146 are also etched through the printed circuit board 100 near the traces 110 and 112. In this example, the side slot 144 is continuous. The side slot 146 is interrupted by the bridge 134. Thus, the side slot 146 is divided into slot segments 150 and 152. The second end of each the end slots 140 and 142 is therefore joined to one end of respective slot segments 150 and 152. Each of the respective slot segments 150 and 152 have opposite ends terminating into the bridge 134. As may be seen in FIG. 2A-2B, the side slot 144 is substantially parallel to the side slot 146. Thus, the bridge 134 constitutes a gap to form a partial loop from the slots 140, 142, 144, and 146. The bridge 134 in this example is located such that the slot segments 150 and 152 are roughly equal in length. However, the location of bridge 134 may be anywhere on the side slots 144 or 146. The bridge 134 may also be located on one of the end slots 140 and 142 except for the parts of the end slots 140 and 142 between the signal traces 110 and 112.

The partial loop 130 disclosed in this example reduces common mode radiation at a target frequency from the signals carried by the traces 110 and 112. The partial loop parameters of loop length and gap length may be adjusted to reduce common mode energy from signals on the traces 110 and 112 and the target frequency. The partial loop 130 relies on modeling of a differential trace circuit using a four port s-parameter.

For a four port (2 signal trace) s-parameter, there are insertion terms, S31 and S42 and induction terms, S41 and S32. For example, in FIG. 1, the differential traces 22 may be modeled based on a first port 40, a second port 42, a third port 44, and a fourth port 46. The induction terms have opposite directions relative to the insertion terms based on Lenz's Law. Based on a mixed mode s-parameter formula, the differential output of the differential signals ($S_{dd21}$) may be expressed as:

$$S_{dd21} = \frac{S_{31} - S_{32} + S_{42} - S_{41}}{2} \qquad (1)$$

Based on the mixed mode s-parameter formula, the common mode output ($S_{cc21}$) of the differential signals may be expressed by:

$$S_{cc21} = \frac{S_{31} + S_{32} + S_{42} + S_{41}}{2}. \qquad (2)$$

The method to reduce common mode output energy via the partial loop structure 130 in FIG. 2A-2B involves increasing the coupling terms. As shown in FIG. 1, there is a return current for a differential signal, represented by the arrow 34, in the ground plane 14 just underneath the trace 22. The return current represented by the arrow 34 flows in the opposite direction of the current represented by arrow 30 in the trace 22. Thus, a return current path may be designed that results in destructive interference at a target frequency. In this situation, a nearby trace, such as the trace 24, will be the new path for the return current. This new return current path increases the coupling terms. Hence, the common mode will be greatly reduced. For a differential signal on a trace, there will be return current in the ground plane going with opposite direction just underneath the trace. Thus, a partial loop structure such as the partial loop 130 may be designed to filter out return current at a target frequency. The partial loop structure 130 provides additional inductance and capacitance and behaves as an LC filter for the return current.

In this situation, the nearby trace will be a new path for the return current and increase the coupling terms. Thus, if a differential signal flows through the trace 110, a return current path will be guided by the partial loop 130 through the trace 112. Hence, common mode will be greatly reduced. The formula for reduction of common mode is expressed as:

$$L_{path} - K_1 * L_{gap} = \frac{K_2}{2f * TD} \text{ where} \qquad (3)$$

$$K_1 * L_{gap} < \frac{L_{path}}{2}$$

In the above equation, the length of the path of the partial loop is $L_{path}$ and the length of the gap between the two slots in the loop is $L_{gap}$. TD is the time delay per mil length for a differential signal to propagate in the trace, f is the target radiation frequency, and $K_1$ and $K_2$ are scaling coefficients that depend on the physical structure of the differential trace pair including factors such as thickness and trace material. In this example, the scaling constants are fitted by simulation values. Different PCB structures will have different constants. By using the above equation, an optimal path length for the partial loop as well as a length of the gap in the partial loop may be determined for reduction of radiation at the target frequency. The determined lengths may then be incorporated in fabricating the slots in the circuit board that make up the partial loop under the differential traces. Other different shapes may be used for the partial loop.

Figure 2C:
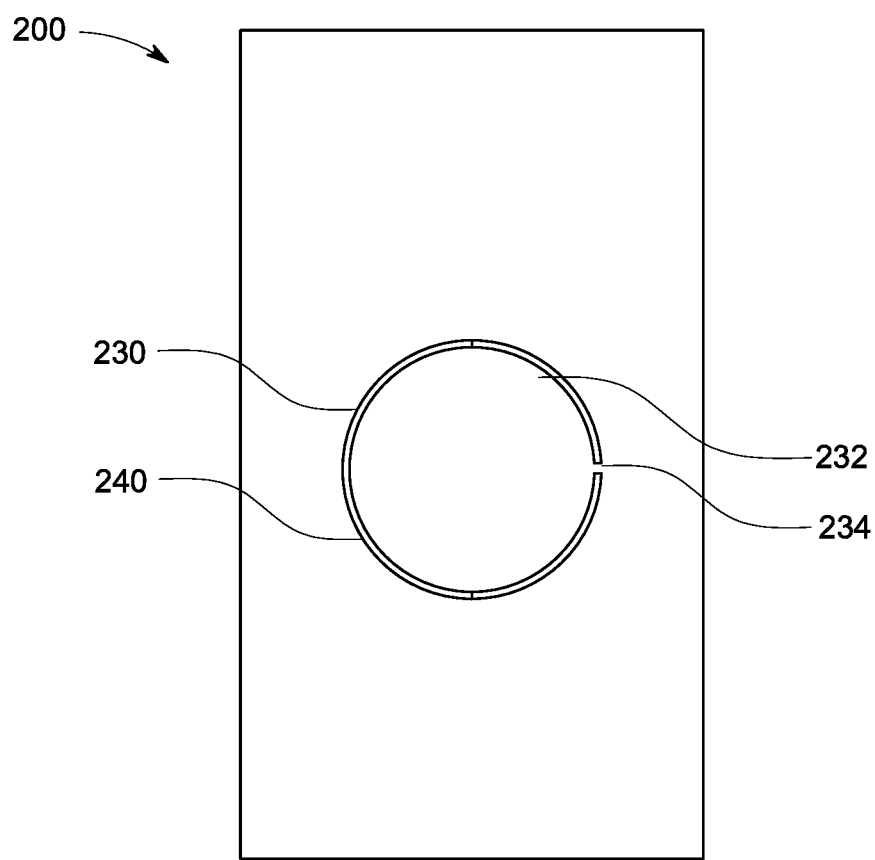
FIG. 2C is a top view of another printed circuit board with a partial loop that functions as a filter for common mode radiation from signal traces.

FIG. 2C shows a top view of a different shaped partial loop. FIG. 2C shows an example printed circuit board 200 for supporting traces similar to the traces 110 and 112 in FIG. 2A. The printed circuit board 200 is mounted on a ground layer. In order to decrease interference, the circuit board 200 includes a partial loop structure 230 that reduces common mode energy. For example, partial loop structure 230 may reduce common mode energy at an example target frequency of 8 GHz. The incorporation of such a partial loop structure 230 thereby decreases the electronic noise generated by traces on the printed circuit board 200. The target frequency depends on the trace data rate of the signals transmitted on the traces (not shown) on the circuit board 200.

The partial loop 230 is formed by etching out part of the printed circuit board 200. Thus, an island 232 of the printed circuit board material is formed under the signal traces that may be formed on the printed circuit board 200. The island 232 is attached to the rest of the printed circuit board 200 via a bridge 234. The area required for the partial loop 230 is less than what is currently used by filters, freeing up more surface area on the printed circuit board 200. The partial loop 230 includes a largely circular slot 240 etched through the printed circuit board 200. Each of end of the largely circular slot 240 terminate into the bridge 234. However, the location of bridge 134 may be anywhere on the slot 140. The partial loop 230 disclosed in this example reduces common mode radiation at a target frequency from the signals carried by the traces. The partial loop parameters of loop length and gap length may be adjusted to reduce common mode energy from signals on the traces and the target frequency.

Figure 3:
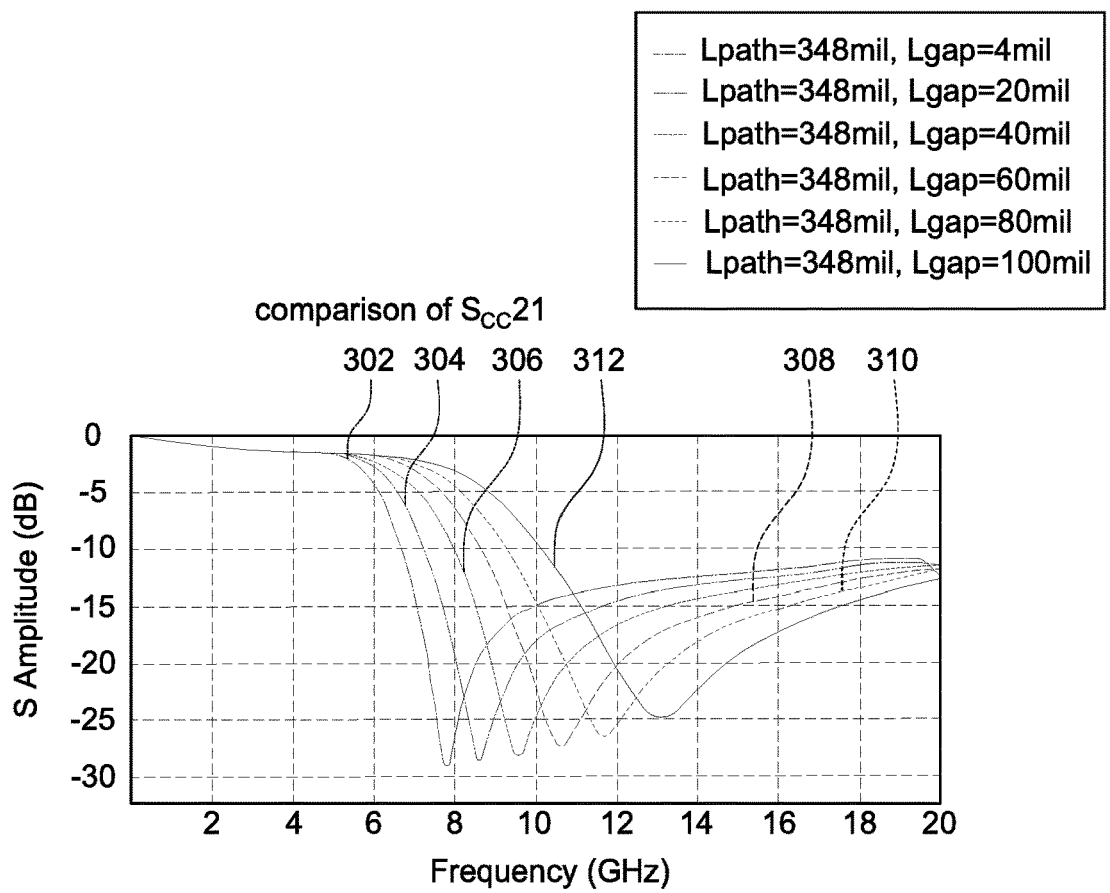
FIG. 3 is a graph of output levels at different frequencies from the differential traces in FIG. 2A-2B showing the effect of the partial loop.

FIG. 3 shows a graph that shows example outputs from different partial loop parameters adopting the above described design methodology in relation to the example printed circuit board 100 shown in FIGS. 2A-2B. The curves in FIG. 3 are the results of simulations for fitting the scaling coefficients $K_1$ and $K_2$. FIG. 3 shows various comparisons of the amplitudes of induction term values plotted against frequency. Each of the induction term curves shown in FIG. 3 are from a constant loop path length of 328 mil but different gap lengths interrupting the loop. Thus, a first curve 302 represents a gap length of 4 mil, a second curve 304 represents a gap length of 20 mil, a third curve 306 represents a gap length of 40 mil, a fourth curve 308 represents a gap length of 60 mil, a fifth curve 310 represents a gap length of 80 mil, and a sixth curve 312 represents a gap length of 100 mil.

In this example, the target radiation frequency is 8 GHz and the time delay, TD, is $1.4285*10^{-13}$ seconds for each of the curves. The example micro-strip traces such as the traces 110 and 112 in FIG. 2 are fabricated from a dielectric material having a dielectric constant of 3.8 and a thickness of 2.7 mil in this example. With these parameters, the constants $K_1$ and $K_2$ are 1.5 and ⅔ correspondingly. In this case, the length of the partial loop path ($L_{path}$) is 328 mil, and the gap length can vary depending on the desired target frequency. In this example, the minimum width across the traces 110 and 112 in FIG. 2A is 25 mil. The minimum length of the slots parallel to the traces 110 and 112 is 4 mil.

The common mode output ($S_{cc21}$) results with different gap lengths ($L_{gap}$) may be calculated and verified by a simulation creating a 3D structure in EDA tool to simulate the equivalent channel model. In comparison with other shapes of etched out designs, such as a U-shape void that requires a longer path length such as 440 mil, the partial loop structure 130 in FIG. 2 can have a deep drop at the same target frequency but with a smaller routing area required on the printed circuit board 100.

Figure 4:
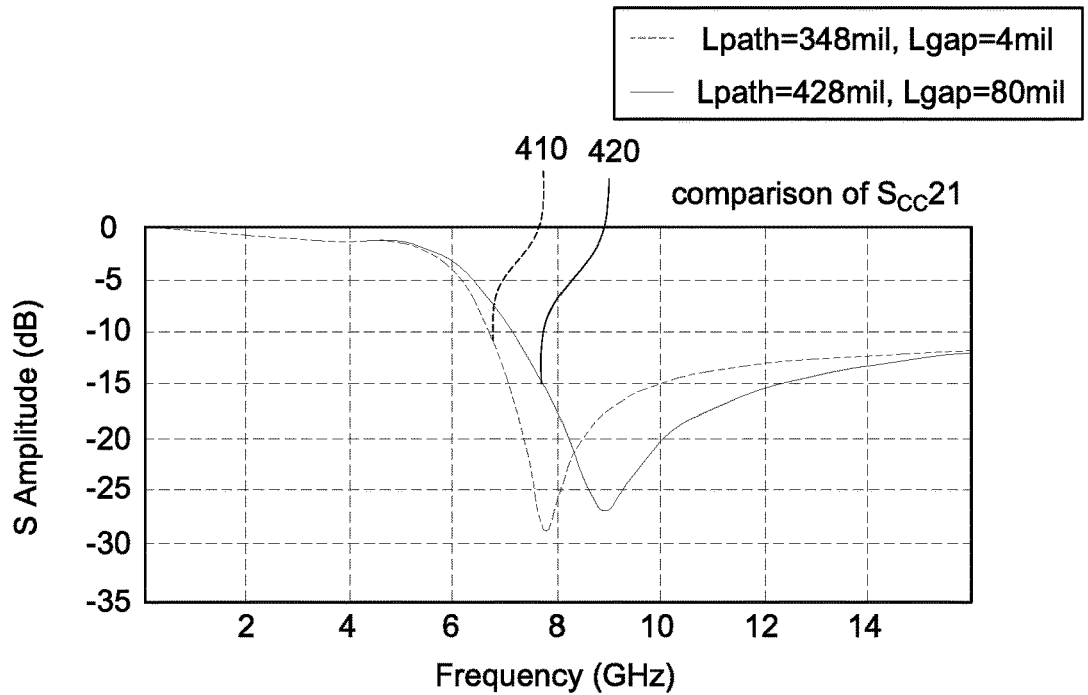
FIG. 4 is a graph of the output levels at different frequencies from different length partial loops.

FIG. 4 is a graph that shows a comparison of curves associated with the common mode reduction for different path lengths. Thus, FIG. 4 shows one curve 410 of a loop structure, such as the loop structure 130 in FIG. 2, having a path length of 328 mil and a gap length of 4 mil between the side slot segments. A second curve 420 shows a path length of 428 mil and a gap length of 80 mil between the side slot segments. As may be seen in the curve 410, the largest dip in amplitude occurs at around the target frequency of 8 GHz. The corresponding dip in amplitude occurs in the curve 420 at around 8 GHz. This shows the desirability to minimize the gap between the slots that create the partial loop structure in FIG. 2. Thus FIG. 4 shows that the above described technique is not dependent on the ground voiding length. The first curve 410 has a ground voiding length of 348 mil 4 mil or 344 mil. The second curve 420 has a ground voiding length of 428 mil 80 mil or 348 mil. Thus, the curves 410 and 420 have similar ground voiding lengths but produce different results in common mode reduction.

FIG. 5 is a table that shows different path lengths and gap lengths and the resulting calculated and expected reduction frequencies. The calculated reduction frequencies are determined based on the above equation. The expected reduction frequencies are determined from simulation results. The table in FIG. 5 shows that reduction frequencies closest to the target value of 8 GHz may be accomplished for a gap of 4 mil and a length of 348 mil. A longer length of 428 mil with a gap of 80 mil has an expected reduction frequency of 8.8 GHz, and an actual reduction frequency of 8.91 GHz. Thus, the last entry reflects the curve 420 in FIG. 4.

As used in this application, the terms "component," "module," "system," or the like, generally refer to a computer-related entity, either hardware (e.g., a circuit), a combination of hardware and software, software, or an entity related to an operational machine with one or more specific functionalities. For example, a component may be, but is not limited to being, a process running on a processor (e.g., digital signal processor), a processor, an object, an executable, a thread of execution, a program, and/or a computer. By way of illustration, both an application running on a controller, as well as the controller, can be a component. One or more components may reside within a process and/or thread of execution, and a component may be localized on one computer and/or distributed between two or more computers. Further, a "device" can come in the form of specially designed hardware; generalized hardware made specialized by the execution of software thereon that enables the hardware to perform specific function; software stored on a computer-readable medium; or a combination thereof.

The terminology used herein is for the purpose of describing particular embodiments only, and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof, are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art. Furthermore, terms, such as those defined in commonly used dictionaries, should be interpreted as having a meaning that is consistent with their meaning in the context of the relevant art, and will not be interpreted in an idealized or overly formal sense unless expressly so defined herein.

While various embodiments of the present invention have been described above, it should be understood that they have been presented by way of example only, and not limitation. Although the invention has been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

What is claimed is:

1. A high speed circuit, comprising:
a ground plane layer;
a printed circuit board having a first surface, the printed circuit board attached to the ground plane layer opposite the first surface;
a pair of first and second differential traces on the first surface of the printed circuit board, the differential traces carrying an electrical signal;
a partial loop extending through the printed circuit board, the partial loop including first and second end slots under the first and second differential traces, and a pair of side slots substantially parallel to the differential traces;
an anchor member connecting the printed circuit board to an island formed by the first and second end slots and side slots, the anchor member forming a gap in one of the end slots or side slots; and
wherein the length of the side slots and the length of the gap is selected to reduce a target common mode frequency from the electrical signal.

2. The high speed circuit of claim 1, wherein the two side slots have identical shapes.

3. The high speed circuit board of claim 1, wherein the length of the two side slots and the length of the gap is determined by:

$$L_{path} - K_1 * L_{gap} = \frac{K_2}{2f * TD}$$

wherein the length of the side slots is $L_{path}$, the length of the gap is $L_{gap}$, TD is a time delay per mil length for a differential signal to propagate in the traces, f is the target common mode frequency, and $K_1$ and $K_2$ are scaling coefficients.

4. The high speed circuit board of claim 3, wherein the length of the gap and the length of the two side slots are limited by:

$$K_1 * L_{gap} < \frac{L_{path}}{2}.$$

5. The high speed circuit board of claim 1, wherein the anchor member is located in the middle of one of the side slots.

6. The high speed circuit board of claim 1, wherein the target common mode frequency depends on a trace data rate of the electrical signal carried on the differential traces.

7. A method of producing a low interference differential trace, the method comprising:
forming first and second differential traces on a first surface of a printed circuit board;
joining a ground plane layer to an opposite surface of the printed circuit board to the first surface;
selecting a path length and gap length for a partial loop on the printed circuit board to reduce a target common mode frequency from a signal carried by the traces;
forming a first and second end slot through the printed circuit board under the first and second differential traces, the first and second end slots separated by the determined path length;
forming a pair of side slots through the printed circuit board, the pair of side slots connecting the first and second end slots; and forming an anchor member to create a gap in one of the end slots or one of the side slots, the length of the gap being the determined gap length.

8. The method of claim 7, wherein the two side slots have identical shapes.

9. The method of claim 7, wherein the length of the two side slots and the length of the gap is determined by:

$$L_{path} - K_1 * L_{gap} = \frac{K_2}{2f * TD}$$

wherein the length of the side slots is $L_{path}$, the length of the gap is $L_{gap}$, TD is the time delay per mil length for a differential signal to propagate in the traces, f is the target common mode frequency, and $K_1$ and $K_2$ are scaling coefficients.

10. The method of claim 9, wherein the length of the gap and the length of the two side slots are limited by:

$$K_1 * L_{gap} < \frac{L_{path}}{2}.$$

11. The method of claim 7, wherein the anchor member is located in the middle of one of the side slots.

12. The method of claim 7, wherein the target common mode frequency depends on a trace data rate of the electrical signal carried on the differential traces.

13. A high speed differential trace structure comprising:
a first trace;
a parallel second trace;
a printed circuit board layer having a top surface and an opposite bottom surface, wherein the first and second traces formed on the top surface;
a ground plane layer having a top layer in contact with the opposite bottom surface of the printed circuit board;
a partial loop extending through the printed circuit board, the partial loop including first and second end slots under the first and second differential traces, and a pair of side slots substantially parallel to the differential traces, the end slots and side slots backed by the ground plane layer;
an anchor member connecting the printed circuit board to an island formed by the first and second end slots and side slots, the anchor member forming a gap in one of the end slots or side slots; and
wherein the length of the side slots and the length of the gap are selected to reduce a target common mode frequency based on electrical signals carried through the differential traces.

14. The high speed differential trace structure of claim 13, wherein the two side slots have identical shapes.

15. The high speed differential trace structure of claim 13, wherein the length of the two side slots and the length of the gap is determined by:

$$L_{path} - K_1 * L_{gap} = \frac{K_2}{2f * TD}$$

wherein the length of the side slots is $L_{path}$, the length of the gap is $L_{gap}$, TD is a time delay per mil length for a differential signal to propagate in the traces, f is the target common mode frequency, and $K_1$ and $K_2$ are scaling coefficients.

16. The high speed differential trace structure of claim 15, wherein the length of the gap and the length of the two side slots are limited by:

$$K_1 * L_{gap} < \frac{L_{path}}{2}.$$

17. The high speed circuit board of claim high speed differential trace structure of claim 13, wherein the anchor member is located in the middle of one of the side slots.

18. The high speed differential trace structure of claim 13, wherein the target common mode frequency depends on a trace data rate of the electrical signal carried on the differential traces.

* * * * *